United States Patent
Lee et al.

(10) Patent No.: US 11,791,082 B2
(45) Date of Patent: Oct. 17, 2023

(54) LOW-POWER TERAHERTZ MAGNETIC NANO-OSCILLATING DEVICE

(71) Applicant: KOREA UNIVERSITY RESEARCH AND BUSINESS FOUNDATION, Seoul (KR)

(72) Inventors: Kyung-Jin Lee, Seoul (KR); Byong Guk Park, Daejeon (KR); Dong-Kyu Lee, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 729 days.

(21) Appl. No.: 16/939,864

(22) Filed: Jul. 27, 2020

(65) Prior Publication Data

US 2020/0357556 A1      Nov. 12, 2020

Related U.S. Application Data

(63) Continuation of application No. PCT/KR2018/007449, filed on Jun. 29, 2018.

(30) Foreign Application Priority Data

Mar. 15, 2018  (KR) .......................... 10-2018-0030023

(51) Int. Cl.
*H01F 10/32* (2006.01)
*H10N 50/85* (2023.01)
(Continued)

(52) U.S. Cl.
CPC ........ *H01F 10/3254* (2013.01); *G11C 11/161* (2013.01); *G11C 11/1675* (2013.01);
(Continued)

(58) Field of Classification Search
CPC ............. H01F 10/3254; H01F 10/3268; H01F 10/3286; H01F 10/3272; H01F 10/329;
(Continued)

(56) References Cited

U.S. PATENT DOCUMENTS

2011/0109397 A1* 5/2011 Delaet .................. H03B 15/006
                                                                 331/157
2015/0041934 A1   2/2015 Khvalkovskiy et al.
(Continued)

FOREIGN PATENT DOCUMENTS

CN    106252503 A    12/2016
EP    2 323 252 A1    5/2011
(Continued)

OTHER PUBLICATIONS

Cheng, Ran et al., "Terahertz Antiferromagnetic Spin Hall Nano-Oscillator," *Physical review letters*, vol. 116, Issue 20, May 20, 2016 (pp. 207603-1-207603-5).
(Continued)

*Primary Examiner* — Arnold M Kinkead
(74) *Attorney, Agent, or Firm* — NSIP Law

(57) ABSTRACT

A magnetic nano oscillating device, according to an embodiment of the present invention, comprises: a ferromagnetic layer disposed on a substrate; a non-magnetic conductive layer laminated on the ferromagnetic layer; an antiferromagnetic layer (or a ferrimagnetic layer) laminated on the non-magnetic conductive layer; and first and second electrodes respectively contacting both side surfaces of the ferromagnetic layer and the non-magnetic conductive layer. The antiferromagnetic layer (or ferrimagnetic layer) is a thin film made of a material magnetized in perpendicular or in-plane direction to a layer surface, the ferromagnetic layer is in-plane magnetized to a layer surface of the ferromagnetic layer, and an in-plane current injected into the ferromagnetic layer and the non-magnetic conductive layer through the first and second electrodes provides a spin current including a spin in a thickness direction of the thin film transferred to the antiferromagnetic layer (or ferrimagnetic layer), thereby causing magnetization precessional motion of a sub-lattice of the antiferromagnetic layer (or ferrimagnetic layer).

12 Claims, 14 Drawing Sheets

(51) Int. Cl.
*H10N 52/00* (2023.01)
*H10N 52/80* (2023.01)
*G11C 11/16* (2006.01)

(52) U.S. Cl.
CPC ......... *H01F 10/3268* (2013.01); *H10N 50/85* (2023.02); *H10N 52/00* (2023.02); *H10N 52/80* (2023.02)

(58) Field of Classification Search
CPC ........ H10N 50/85; H10N 52/00; H10N 52/80; H10N 50/10; H10N 50/80; G11C 11/161; G11C 11/1675; H03B 15/006
USPC ............................ 365/158; 257/421; 331/157
See application file for complete search history.

(56) References Cited

U.S. PATENT DOCUMENTS

| | | | |
|---|---|---|---|
| 2015/0213868 A1* | 7/2015 | Wu | G11C 11/161 365/154 |
| 2016/0276006 A1 | 9/2016 | Ralph et al. | |
| 2018/0301266 A1* | 10/2018 | Ou | G11C 11/161 |
| 2020/0035282 A1* | 1/2020 | Lee | H01F 10/3286 |
| 2020/0243124 A1* | 7/2020 | Bozdag | G11C 11/1659 |
| 2020/0302984 A1* | 9/2020 | Kai | H10B 61/00 |

FOREIGN PATENT DOCUMENTS

| | | |
|---|---|---|
| JP | 2006-060172 A | 3/2006 |
| JP | 2011-101015 A | 5/2011 |
| JP | 2017-204833 A | 11/2017 |
| KR | 10-2002-0054656 A | 7/2002 |
| KR | 10-2006-0039748 A | 5/2006 |
| KR | 10-2016-0134598 A | 11/2016 |
| WO | WO 2015/102739 A2 | 7/2015 |

OTHER PUBLICATIONS

Japanese Office Action dated Sep. 7, 2021 in counterpart Japanese Patent Application No. 2020-541866 (2 pages in Japanese).
International Search Report dated Dec. 3, 2018 in corresponding International Patent Application No. PCT/KR2018/007449 (2 pages in English, 2 pages in Korean).
Extended European Search Report dated Nov. 10, 2021, in counterpart European Patent Application No. 18909635.7 (10 pages in English).

* cited by examiner

LOW-POWER TERAHERTZ MAGNETIC NANO-OSCILLATING DEVICE

CROSS-REFERENCE TO RELATED APPLICATIONS

This application is a continuation of and claims priority to PCT/KR2018/007449 filed on Jun. 29, 2018, which claims priority to Korea Patent Application No. 10-2018-0030023 filed on Mar. 15, 2018, the entireties of which are both hereby incorporated by reference.

TECHNICAL FIELD

The present disclosure relates to a low-power terahertz (THz) nano-oscillating device and, more particularly, to a nano-oscillating device in which in-plane current is applied to a stacked structure of a ferromagnetic layer and a nonmagnetic layer to cause a precession motion of sub-lattice magnetization of an adjacent antiferromagnetic layer (or a ferrimagnetic layer).

BACKGROUND

FIG. 1 is a conceptual diagram of a conventional magnetic nano-oscillating device.

Referring to FIG. 1, a magnetic nano-oscillating device 100 uses a spin Hall spin torque, generated by in-plane current flowing through a conducting line, and an antiferromagnetic material 130. The magnetic nano-oscillating device 100 includes a conductive line 120/an antiferromagnetic layer 130, and a precession motion of an antiferromagnetic layer 130 is induced by current flowing to the conductive wire 120 in an in-plane direction. An up-spin electron and a down-spin electron are polarized in opposite directions due to spin-orbit coupling. Thus, spin current is generated in a z direction perpendicular to a direction of externally applied current direction (an x direction). In this case, a spin transferred by the spin current has an element in a y direction perpendicular to both the external current direction (the x direction) and the spin current direction (the z direction). When the spin element flows into an adjacent ferromagnetic material, the ferromagnetic material receives a spin transfer torque. Such a torque is called a spin Hall spin torque.

However, a nano-oscillating device using a spin Hall spin torque and an antiferromagnetic material is required to have significantly high current density. In addition, the nano-oscillating device has a limitation in frequency tunability. To overcome the limitation, a nano-oscillating device, oscillating even at low current density, is required.

SUMMARY

An aspect of the present disclosure is to reduce current required for magnetic oscillation. To this end, a conductive line having a structure of a ferromagnetic layer and a nonmagnetic layer is introduced. When a structure of a ferromagnetic layer, a nonmagnetic layer, and an antiferromagnetic layer (or a ferrimagnetic layer) is used, low current density may be achieved and frequency tunability may be improved.

According to an aspect of the present disclosure, a magnetic nano-oscillating device includes a ferromagnetic layer disposed on a substrate, a nonmagnetic conductive layer stacked on the ferromagnetic layer, an antiferromagnetic layer stacked on the nonmagnetic conductive layer, and first and second electrodes, respectively being in contact with both side surfaces of the ferromagnetic layer and the nonmagnetic conductive layer. The antiferromagnetic layer is a thin film formed of a material magnetized in a perpendicular or in-plane direction to a layer surface. The ferromagnetic layer is in-plane magnetized on a layer surface of the ferromagnetic layer. In-plane current, injected into the ferromagnetic layer and the nonmagnetic conductive layer through the first and second electrodes, provides spin current, including a spin in a thickness direction of a thin film transferred to the antiferromagnetic layer, to cause magnetization precession of a sub-lattice of the antiferromagnetic layer.

In an example embodiment, the magnetic nano-oscillating device may further include a magnetic tunnel junction disposed on the antiferromagnetic layer. The magnetic tunnel junction may include a free layer/a tunnel insulating layer/a pinned layer, and the free layer of the magnetic tunnel junction may have an exchange interaction with the antiferromagnetic layer.

In an example embodiment, the ferromagnetic layer may be formed of one selected from Fe, Co, Ni, B, Si, Zr, and mixtures thereof.

In an example embodiment, the antiferromagnetic layer may be formed of one selected from Ir, Pt, Mn, Cr, FeMn, NiO, Fe2O3, and mixtures thereof.

In an example embodiment, the nonmagnetic conductive layer may be formed of one selected from Cu, Ta, Pt, W, Ti, Bi, and mixtures thereof.

In an example embodiment, each of the first and second electrodes may be formed of one selected from Cu, Ta, Pt, W, Ti, Bi, Ir, and mixtures thereof.

According to an aspect of the present disclosure, a magnetic nano-oscillating device includes a ferromagnetic layer disposed on a substrate, a nonmagnetic conductive layer stacked on the ferromagnetic layer, a ferrimagnetic layer stacked on the nonmagnetic conductive layer, and first and second electrodes, respectively being in contact with both side surfaces of the ferromagnetic layer and the nonmagnetic conductive layer. The ferrimagnetic layer is a thin film formed of a material magnetized in a perpendicular or in-plane direction to a layer surface. The ferromagnetic layer is in-plane magnetized on a layer surface of the ferromagnetic layer. In-plane current, injected into the ferromagnetic layer and the nonmagnetic conductive layer through the first and second electrodes, provides spin current, including a spin in a thickness direction of a thin film transferred to the ferrimagnetic layer, to cause magnetization precession of a sub-lattice of the ferrimagnetic layer.

In an example embodiment, the magnetic nano-oscillating device may further include a magnetic tunnel junction disposed on the ferrimagnetic layer. The magnetic tunnel junction includes a free layer/a tunnel insulating layer/a pinned layer, and the free layer of the magnetic tunnel junction may have an exchange interaction with the antiferromagnetic layer.

In an example embodiment, the ferrimagnetic layer may be formed of one selected from Co, Gd, Tb, Mn, Ir, Ge, Se, Cr, Y, Fe, garnet, a rare earth-transition metal (RE-TM) alloy, mixtures thereof.

According to an aspect of the present disclosure, a magnetic nano-oscillating device includes a first ferromagnetic layer disposed on a substrate, a first nonmagnetic conductive layer disposed on the first ferromagnetic layer, a second ferromagnetic layer disposed on the first nonmagnetic conductive layer, a second nonmagnetic conductive layer disposed on the second ferromagnetic layer, a third ferromagnetic layer disposed on the second nonmagnetic conductive layer, and first and second electrodes, respectively being in contact with both side surfaces of the first ferromagnetic layer and the first nonmagnetic conductive layer. The first ferromagnetic layer is a thin film formed of a material having a fixed magnetization direction and magnetized in a direction parallel to a layer surface. The second ferromagnetic layer and the third ferromagnetic layer are thin films, each having an antiferromagnetic exchange interaction due to the second nonmagnetic conductive layer. In-plane current, injected into the first ferromagnetic layer and the first nonmagnetic conductive layer through the first and second electrodes, provides spin current including a spin in a thickness direction of a thin film transferred to the second ferromagnetic layer and the third ferromagnetic layer to cause magnetization precession of each of the second ferromagnetic layer and the third ferromagnetic layer.

In an example embodiment, the magnetic nano-oscillating device may further include a magnetic tunnel junction disposed on the third ferromagnetic layer. The magnetic tunnel junction may include a tunnel insulating layer/a pinned layer.

In an example embodiment, each of the first ferromagnetic layer, the second ferromagnetic layer, and the third ferromagnetic layer may be formed of one selected from Fe, Co, Ni, B, Si, Zr, and mixtures thereof, the first nonmagnetic conductive layer may be formed of one selected from Cu, Ta, Pt, W, Ti, Bi, and mixtures thereof, and the second nonmagnetic conductive layer may be formed of one selected from Ru, Ta, Rh, Ir, Cr, Re, Mo, W, V, and mixtures thereof.

BRIEF DESCRIPTION OF THE DRAWINGS

The present disclosure will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

DETAILED DESCRIPTION

Figure 1:
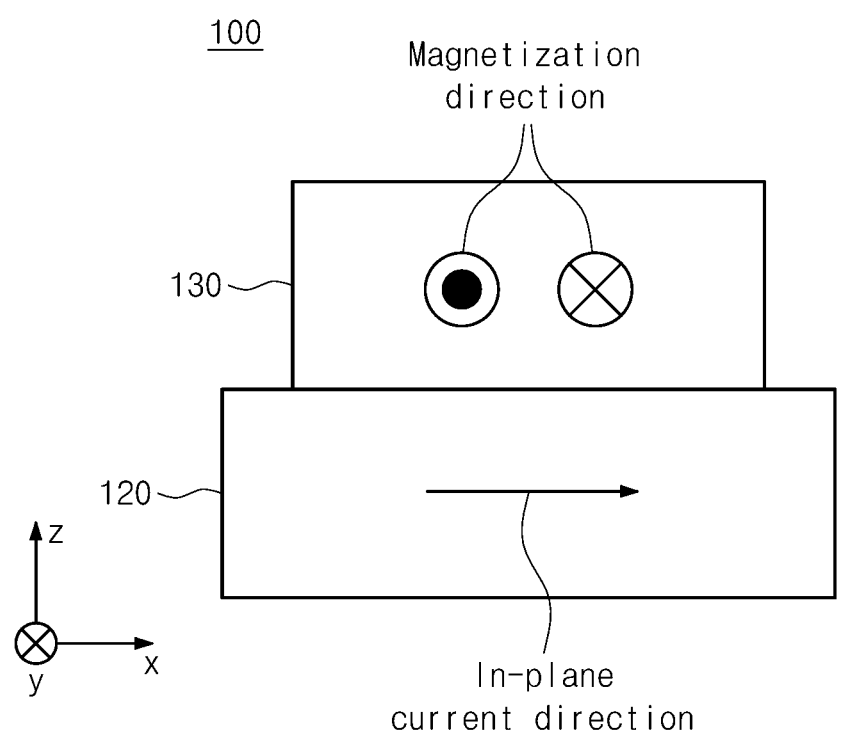
FIG. 1 is a conceptual diagram of a conventional magnetic nano-oscillating device.

A ferromagnetic material refers to a material spontaneously magnetized even when a strong magnetic field is not externally applied. A resonant frequency of the ferromagnetic material is determined by a magnetic anisotropy field. At this point, a frequency f is given by Equation 1.

$$f = \gamma B_k / 2\pi \qquad \text{Equation 1}$$

In Equation 1, $\gamma(=2\times10^{11}\ T^{-1}s^{-1})$ denotes a gyromagnetic ratio, $B_k$ denotes a magnetic anisotropy field of the ferromagnetic material. In a common ferromagnetic material, a magnetic anisotropy field magnetic field has a magnitude of about 1 T. Accordingly, a frequency of the nano-oscillating device using a ferromagnetic material is limited to several tens of gigahertz (GHz).

In a spin valve structure in which a nonmagnetic material is inserted between two ferromagnetic materials (a first magnetic material/a nonmagnetic material/a second magnetic material) or a magnetic tunnel junction structure in which an insulating material is inserted between two ferromagnetic materials (a first magnetic material/an insulating material/a second magnetic material), when current is applied in a vertical (thickness) direction, current spin-polarized by the first magnetic material (a pinned magnetic layer) transfers its own spin-angular momentum while passing through the second magnetic material (a free magnetic layer). A torque felt by magnetization due to the transfer of the spin angular momentum is called a spin-transfer torque. Reversal of magnetization of the free magnetic layer or a magnetization precession, continuously rotating the magnetization, may be performed using a spin-transfer torque. However, a magnetic nano-oscillating device using a ferromagnetic material has a low operating frequency, which is a limitation.

An antiferromagnetic material refers to a material having an antiferromagnetic exchange interaction in which adjacent magnetic moments try to maintain opposite directions in atomic units. Also, an antiferromagnetic material refers to a material in which adjacent magnetic moments have the same size.

A ferrimagnetic material refers to a material in which adjacent magnetic moments have different sizes or directions to each other. Since some ferrimagnetic materials have antiferromagnetic exchange interactions between two adjacent magnetic moments, directions of the adjacent magnetic moments are opposite or substantially opposite each other, similarly to the antiferromagnetic material. In the present disclosure, the ferrimagnetic material refers to a ferrimagnetic material having antiferromagnetic characteristics.

When magnetic moments are coupled in an antiferromagnetic state in atomic units, a resonant frequency is given by Equation 2.

$$f=\gamma(B_k B_{ex})^{1/2}/2\pi \qquad \text{Equation 2}$$

In Equation 2, $B_{ex}$ denotes an antiferromagnetic exchange field of an antiferromagnetic (ferrimagnetic) material. A magnetic anisotropy field is about 1 T, while the antiferromagnetic exchange magnetic field is about 100 T to about 1000 T. Therefore, a frequency of the nano-oscillating device using an antiferromagnetic (ferrimagnetic) material has a range of several terahertz (THz).

Currently, in electromagnetic spectrum, oscillation is performed in a range, in which a frequency is tens of GHz or less, using an electronic element. The oscillation is performed in a range, in which a frequency is several tens of THz or more, using an optical element. However, an appropriate element for generating, detecting, and regulating signals has not been found in the range from 0.1 THz to 10 THz. A signal in the range of 0.1 THz to 10 THz is harmless to a human body and has high material selectivity because characteristics such as transmittance of a THz signal are different depending on a material, and corresponds to resonant frequencies of various molecules. Therefore, the signal in the range of 0.1 THz to 10 THz may be used in molecular spectrum analysis. Thus, a magnetic oscillation element, including an antiferromagnetic layer (or a ferrimagnetic layer) corresponding to a resonant frequency in the range of 0.1 THz to 10 THz, needs to achieve low current density and improve frequency tunability.

A nano-oscillating device according to an example embodiment includes a ferromagnetic layer/a nonmagnetic conductive layer/an antiferromagnetic layer (or a ferrimagnetic layer, which are sequentially stacked. A magnetization precession of a sub-lattice of the antiferromagnetic layer (or the ferrimagnetic layer) is induced by current flowing through the ferromagnetic layer and the nonmagnetic conductive layer in the in-plane direction. The magnetization direction of the sub-lattice of the antiferromagnetic layer (or the ferrimagnetic layer) is perpendicular to an in-plane parallel direction or the in-plane direction. Spin current, generated in an interface between the ferromagnetic layer and the nonmagnetic conductive layer induces a magnetization precession of the sub-lattice of the antiferromagnetic layer (or the ferrimagnetic layer).

A nano-oscillating device according to an example embodiment includes a first ferromagnetic layer/a first nonmagnetic conductive layer/a second ferromagnetic layer/a second nonmagnetic conductive layer/a third ferromagnetic layer, which are sequentially stacked. The second ferromagnetic layer and the third ferromagnetic layer have a structure in which magnetization directions of the second ferromagnetic layer and the third ferromagnetic layer are antiparallel to each other through an antiferromagnetic exchange interaction caused by the second nonmagnetic conductive layer interposed therebetween. The magnetization precession of the second ferromagnetic layer and the third ferromagnetic layer having the antiferromagnetic exchange interaction is induced by spin current generated in an interface between the first ferromagnetic layer and the first nonmagnetic conductive layer.

Hereinafter, the present disclosure will be described in more detail based on preferred embodiments. However, these embodiments are for better understanding of the present disclosure, and it is obvious to those skilled in the art that the scope of the present disclosure is not limited thereto. In addition, in the case in which detailed description of known functions or configurations in relation to the present disclosure is judged as unnecessarily making the essence of the present disclosure vague, the detailed description will be excluded.

Figure 2:
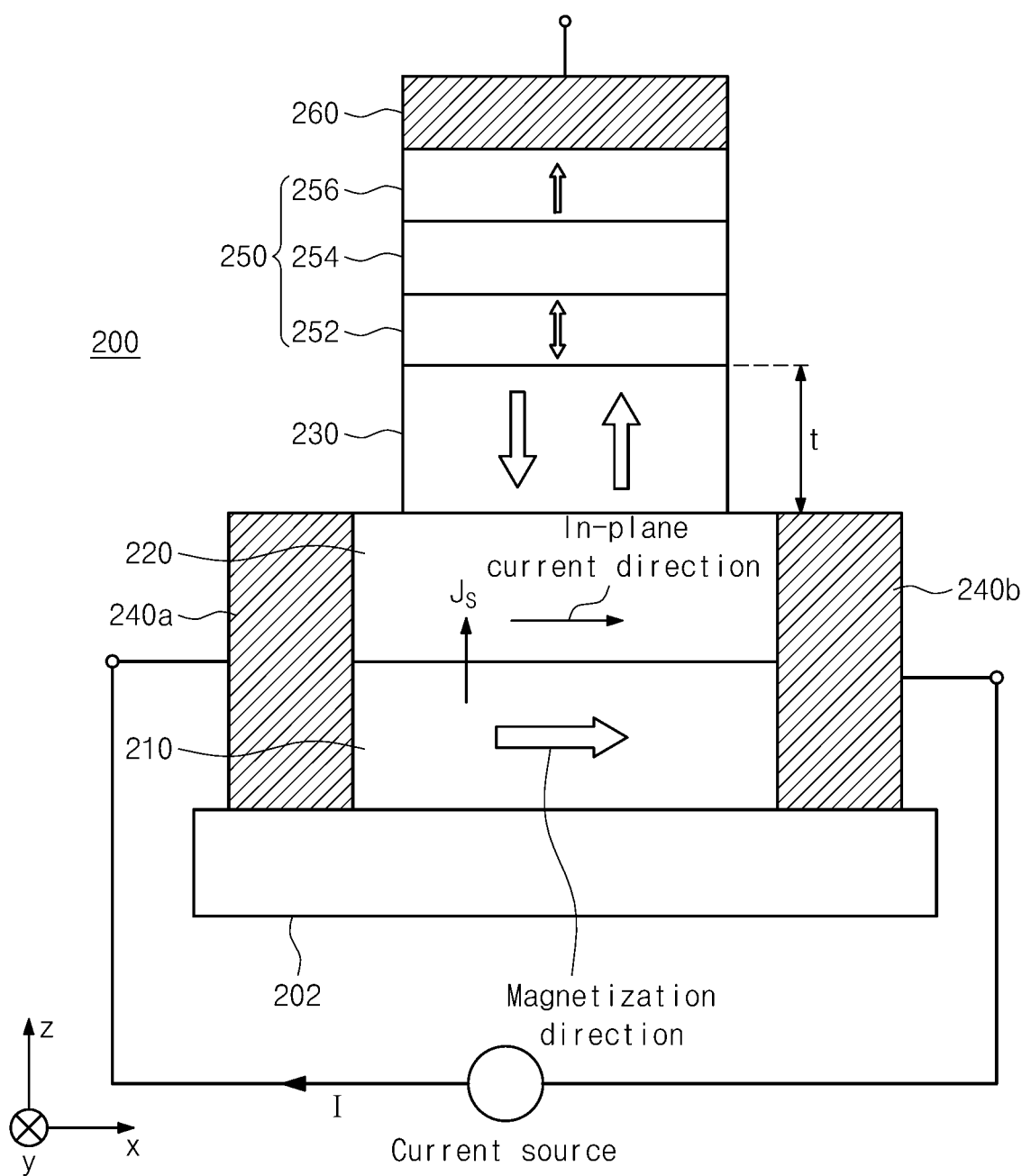
FIG. 2 is a conceptual diagram of a magnetic nano-oscillating device according to an example embodiment of the present disclosure.

FIG. 2 is a conceptual diagram of a magnetic nano-oscillating device according to an example embodiment of the present disclosure.

Figure 3:
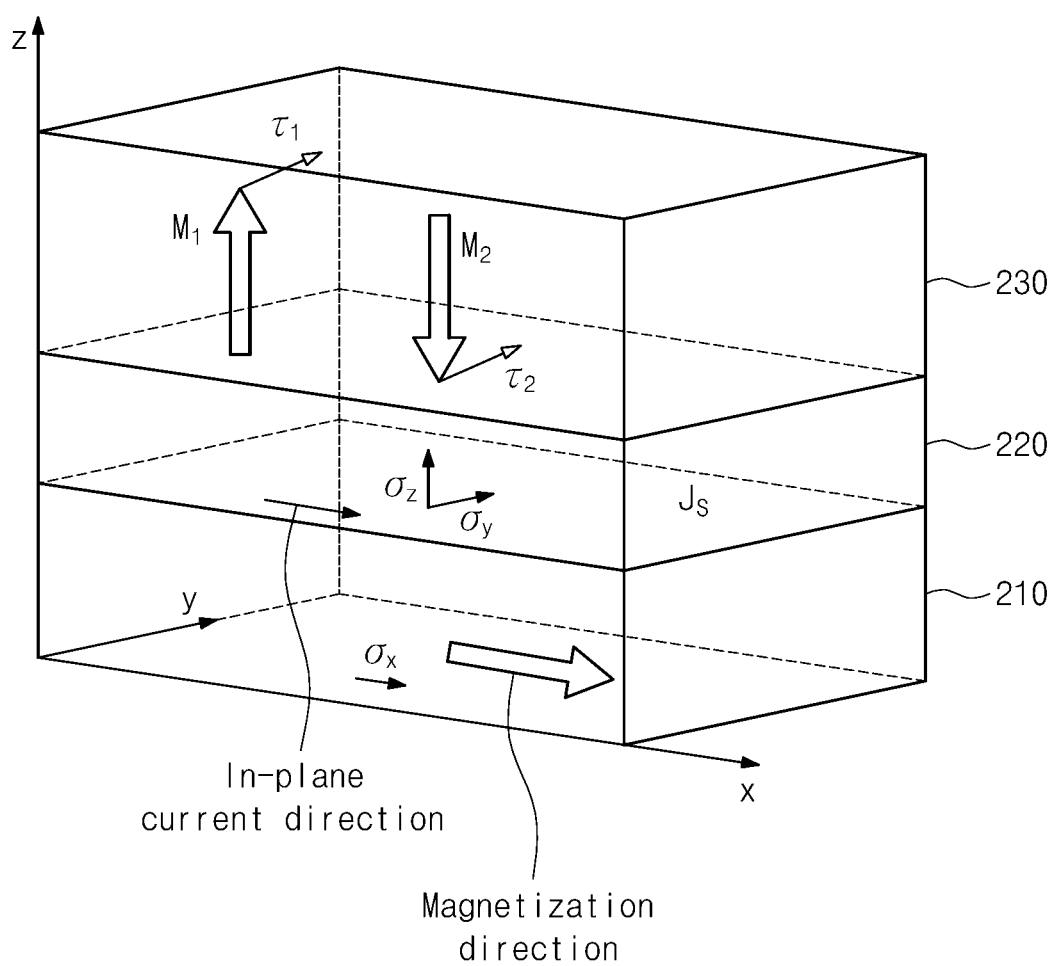
FIG. 3 is a perspective view illustrating oscillation of the magnetic nano-oscillating device in FIG. 2.

FIG. 3 is a perspective view illustrating oscillation of the magnetic nano-oscillating device in FIG. 2.

Referring to FIGS. 2 and 3, a magnetic nano-oscillating device 200 includes a ferromagnetic layer 210, a nonmagnetic conductive layer 220, and an antiferromagnetic layer 230 sequentially stacked on a substrate 202. First and second electrodes 240a and 240b, respectively being in contact with both side surfaces of the ferromagnetic layer 210 and the nonmagnetic layer 220, provide in-plane current I. The in-plane current I provides spin current $J_S$, including a spin $\sigma_z$ polarized in a thickness direction, to the antiferromagnetic layer 230 due to interfacial spin orbital coupling between the ferromagnetic layer 210 and the nonmagnetic layer 220. The ferromagnetic layer 210 has a fixed magnetization direction and is a thin film formed of a material magnetized in a direction parallel to a layer surface. The sub-lattice of the antiferromagnetic layer 230 has a fixed magnetization direction. The antiferromagnetic layer 230 is a thin film formed of a material magnetized in perpendicular or in-plane direction to a layer surface. The ferromagnetic layer 210 is magnetized on a layer surface of the ferromagnetic layer 210 in an in-plane direction. The in-plane current, injected into the ferromagnetic layer 210 and the nonmagnetic conductive layer 220 through the first and second electrodes 240a and 240b, provides the spin current 230, including a spin of the thin film in a thickness direction transferred to the antiferromagnetic layer, to cause magnetization precession of the antiferromagnetic layer 230.

The spin current $J_S$ is generated by an interfacial effect between the ferromagnetic material and the nonmagnetic material, and the spin current has both a y-direction spin and a z-direction spin.

An interfacial spin orbit torque, generated by the spin of the spin current $J_S$, allows magnetization of the antiferromagnetic layer (or the ferrimagnetic layer) to move in precession.

The antiferromagnetic layer 230 may be replaced with a ferrimagnetic layer. A magnetization precession of the sub-lattice in the antiferromagnetic layer (or the ferrimagnetic layer) is induced by current flowing through the ferromagnetic layer 210 and the nonmagnetic conductive layer 220 in the in-plane direction. The magnetization direction of the ferromagnetic layer 210 is aligned in a +x direction. Current flows through the ferromagnetic layer 210 and the nonmagnetic conductive layer 220, and spin current flows to the antiferromagnetic layer (or the ferrimagnetic layer) due to interfacial spin orbital coupling present on the interface.

When the current flows through the ferromagnetic layer 210 and the nonmagnetic conductive layer 220, spin current $J_S$ having a y-direction spin $\sigma_y$ and a z-direction spin $\sigma_z$ and flowing in a thickness direction (the z direction) is generated by spin orbit coupling in a structure of the ferromagnetic layer 210/the nonmagnetic conductive layer 220 having magnetization parallel to a layer surface. The spin current $J_S$ transfers the y-direction spin $\sigma_y$ and the z-direction spin $\sigma_z$ to the antiferromagnetic layer (or the ferrimagnetic layer) to cause precession of the magnetization of the antiferromagnetic layer (or the ferrimagnetic layer).

That is, the spin current $J_S$ flows in a direction perpendicular to the interface. In this case, the antiferromagnetic layer (or the ferrimagnetic layer) has the y-direction spin $\sigma_y$ and the z-direction spin $\sigma_z$ due to an interaction of a spin of electrons, passing through the interface, and a spin polarization accumulated in the interface. That is, in the spin currents $J_S$ flowing in a z-axis direction, the z-direction spin $\sigma_z$ may reduce threshold current density, as compared with the case in which there is no z-direction spin.

In the present disclosure, a spin torque, generated by an interfacial effect between a ferromagnetic layer and a nonmagnetic conductive layer and having both a y-direction spin and a z-direction spin as described above, will be referred to as an interfacial spin orbit torque to be distinguished from an existing spin Hall toque generated by a y-direction spin $\sigma_y$.

Current density, required for the magnetization precession of the sub-lattice of the antiferromagnetic layer (or the ferrimagnetic layer), varies depending on sizes of the y-direction spin $\sigma_y$ and the z-direction spin $\sigma_z$ transferred to the antiferromagnetic layer (or the ferrimagnetic layer) and frequency tunability also varies.

The substrate 202 may be a semiconductor substrate. The substrate 202 may be a silicon substrate.

The ferromagnetic layer 210 is patterned on the substrate 202 in a line shape and may be formed of one selected from Fe, Co, Ni, B, Si, Zr, and mixtures thereof.

The nonmagnetic conductive layer 220 may be formed of one selected from Cu, Ta, Pt, W, Ti, Bi, and mixtures thereof. The ferromagnetic layer and the nonmagnetic conductive layer may be vertically aligned with each other.

The antiferromagnetic layer 230 may be locally disposed on the nonmagnetic conductive layer 220. Alternatively, the antiferromagnetic layer 230 may be transformed to be vertically aligned with the nonmagnetic conductive layer 220. The antiferromagnetic layer 230 may be formed of one selected from Ir, Pt, Mn, Cr, FeMn, NiO, Fe2O3, and mixtures thereof. The sub-lattice of the antiferromagnetic layer 230 may be magnetized in a direction perpendicular to a surface.

The first electrode 240a and the second electrode 240b may be made of a material selected from Cu, Ta, Pt, W, Ti, Bi, Ir, and mixtures thereof. The first electrode 240a and the second electrode 240b may be respectively connected to both ends of the ferromagnetic layer 210 and the nonmagnetic conductive layer 220 to inject current. The current may flow along a conducting line including the ferromagnetic layer 210 and the nonmagnetic conductive layer 220.

A magnetic tunnel junction 250 is disposed on the antiferromagnetic layer 230. The magnetic tunnel junction 250 includes a free layer 252/a tunnel insulating layer 254/a pinned layer 256, and the free layer 252 of the magnetic tunnel junction has an exchange interaction with the antiferromagnetic layer 230. The magnetic tunnel junction 250 may output an oscillating signal due to tunneling resistance. The free layer 252 and the pinned layer 256 may be perpendicular magnetized on an arrangement plane.

The third electrode 260 may be disposed on the magnetic tunnel junction 250. The third electrode 260 may be connected to a wiring for connecting an oscillating signal to another circuit. The third electrode 260 may be formed of one selected from Cu, Ta, Pt, W, Ti, Bi, Ir, and mixtures thereof.

An equation of motion of the sub-lattice magnetization of the antiferromagnetic (or the ferrimagnetic) is given by Equation 3.

$$\frac{\partial M}{\partial t} = -\gamma M_i \times H_{\text{eff},i} + \frac{\alpha}{M_{s,i}} M_i \times \frac{\partial M_i}{\partial t} + \frac{1}{M_{s,i}} \frac{\gamma \hbar J}{2eM_{s,i}t} M_i \times [M_i \times (\eta \hat{y} + \delta \hat{z})]$$

Equation 3

In Equation 3, $M_i$ denotes a magnetization vector of an i-th sub-lattice of an antiferromagnetic layer (or a ferrimagnetic layer), $\gamma$ denotes a gyromagnetic ratio, $M_{s,i}$ denotes a magnetization value of the i-th sub-lattice of the antiferromagnetic layer (or the ferrimagnetic layer), $H_{\text{eff},i}$ denotes all effective magnetic field vectors of the i-th sub-lattice of the antiferromagnetic layer (or the ferrimagnetic layer), and $\alpha$ denotes a Gilbert damping constant. The sub-lattice may be a first sub-lattice or a second sub-lattice. Also, in Equation 3, $\eta$ denotes a ratio of spin current, transferring a y-direction spin $\sigma_y$, to applied current generated in an interface between the ferromagnetic layer and the nonmagnetic conducive layer, and $\delta$ denotes a ratio of spin current, transferring a z-direction spin $\sigma_z$, to applied current generated in an interface between the ferromagnetic layer and the nonmagnetic conducive layer. Also, in Equation 3, $\hbar(=1.05\times10^{-34}$ Jsec) denotes a value obtained by a Planck constant by $2\pi$, J denotes applied current density, and $e(=1.6\times10^{-19}$ C) is the amount of charge of an electron, and t denotes a thickness of the antiferromagnetic layer (or the ferrimagnetic layer). An x direction is a direction in which the antiferromagnetic layer (or the ferrimagnetic layer) extends on the substrate, and a z direction is a thickness direction of the antiferromagnetic layer (or the ferrimagnetic layer).

When the z-direction spin $\sigma_z$ is not transferred to the antiferromagnetic layer (or the ferrimagnetic layer) and only the y-direction spin $\sigma_y$ is transferred thereto, threshold current density $J_{th}$ is given by Equation 4.

$$J_{th} = \frac{2Ket}{\hbar \eta}$$

Equation 4 where $\hbar$ denotes a value obtained by diving a Planck constant by $2\pi$, e denotes the amount of charge of an electron, t denotes a thickness of the antiferromagnetic (or the ferrimagnetic) layer, K denotes magnetic anisotropy energy density and a magnetic anisotropy constant of the antiferromagnetic layer (or the ferrimagnetic layer), and $\eta$ denotes a ratio of the spin current, transferring the y-direction spin $\sigma_y$, to the applied current.

An oscillation frequency of the antiferromagnetic layer (or the ferrimagnetic layer), induced by current density higher than threshold current density corresponding to Equation 4, is described as Equation 5.

$$f = \frac{\gamma \hbar \eta}{4eM_s t \pi a} J$$

Equation 5 where $\gamma$ denotes a gyromagnetic ratio, J denotes current density, $\hbar$ denotes a value obtained by dividing a Planck constant by $2\pi$, e denotes the amount of charge of an electron, t denotes a thickness of the antiferromagnetic layer (or the ferrimagnetic layer), Ms denotes a saturated magnetization value of the sub-lattice of the ferrimagnetic layer (or the ferrimagnetic layer), α denotes a Gilbert damping constant, and η denotes a ratio of spin current, transferring the y-direction spin $\sigma_y$, to the applied current.

When the z-direction spin $\sigma_z$ is not transferred to the antiferromagnetic layer (or the ferrimagnetic layer) and only the y-direction spin $\sigma_y$ is transferred thereto, normalized magnetization N rotates in an x-z plane. The ratio η of the spin current, transferring the y-direction spin $\sigma_y$, to the applied current is not zero and the ratio δ of the spin current, transferring the z-direction spin $\sigma_z$, to the applied current is zero.

The spin current $J_S$ has a z-direction spin ($\sigma_z$) component. When the y-direction spin $\sigma_y$ is not transferred to the antiferromagnetic layer (or the ferrimagnetic layer) and only the z-direction spin $\sigma_z$ is transferred thereto, the threshold current density is given by Equation 6.

$$J_{th} = \frac{4\alpha e t}{\hbar \delta d}\sqrt{AK} \qquad \text{Equation 6}$$

where $\hbar$ denotes a value obtained by dividing a Planck constant by $2\pi$, e denotes the amount of charge of an electron, t denotes a thickness of the antiferromagnetic layer (or the ferrimagnetic layer), K denotes magnetic anisotropy energy density of the antiferromagnetic layer (or the ferrimagnetic layer), A denotes an antiferromagnetic exchange interaction constant, a denotes a Gilbert damping constant, d denotes a distance between sub-lattices of the antiferromagnetic layer (or the ferrimagnetic layer), and δ denotes a ratio of the spin current, transferring the z-direction spin $\sigma_z$, to the applied current.

An oscillation frequency of the antiferromagnetic layer (or the ferrimagnetic layer) for current density higher than threshold current density corresponding to Equation 6 is described as Equation 7.

$$f = \frac{\gamma\hbar\delta}{4eM_s t\pi a}J \qquad \text{Equation 7}$$

where γ denotes a gyromagnetic ratio, J denotes current density, $\hbar$ denotes a value obtained by dividing a Planck constant by $2\pi$, e denotes the amount of charge in an electron, t denotes a thickness of the antiferromagnetic (or the ferrimagnetic) layer, $M_s$ denotes the amount of saturated magnetization of a sub-lattice of the antiferromagnetic layer (or the ferrimagnetic layer), a denotes a Gilbert damping constant, and η denotes a ratio of the spin current, transferring the z-direction spin $\sigma_z$, to the applied current.

According to an example embodiment, both the y-direction spin $\sigma_y$ and the z-direction spin $\sigma_z$ are transferred to the antiferromagnetic layer (or the ferrimagnetic layer) by an interfacial spin orbital torque. In this case, the threshold current density is determined as lower threshold current density, among threshold current densities corresponding to Equation 4 and Equation 6. In this case, a frequency which may oscillate is described as Equation 8.

$$f = \frac{\gamma\hbar\sqrt{\delta^2 + \eta^2}}{4eM_s t\pi a}J \qquad \text{Equation 8}$$

The ratio η of the spin current, transferring the y-direction spin $\sigma_y$, to applied current is not zero, and the ratio δ of the spin current, transferring the z-direction spin $\sigma_z$, to the applied current is not zero. When both the z-direction spin $\sigma_z$ and the y-direction spin $\sigma_y$ are transferred to the antiferromagnetic layer (or the ferrimagnetic layer), the normalized magnetization N is rotated to have an x-y plane component and an x-z plane component.

Figure 4:
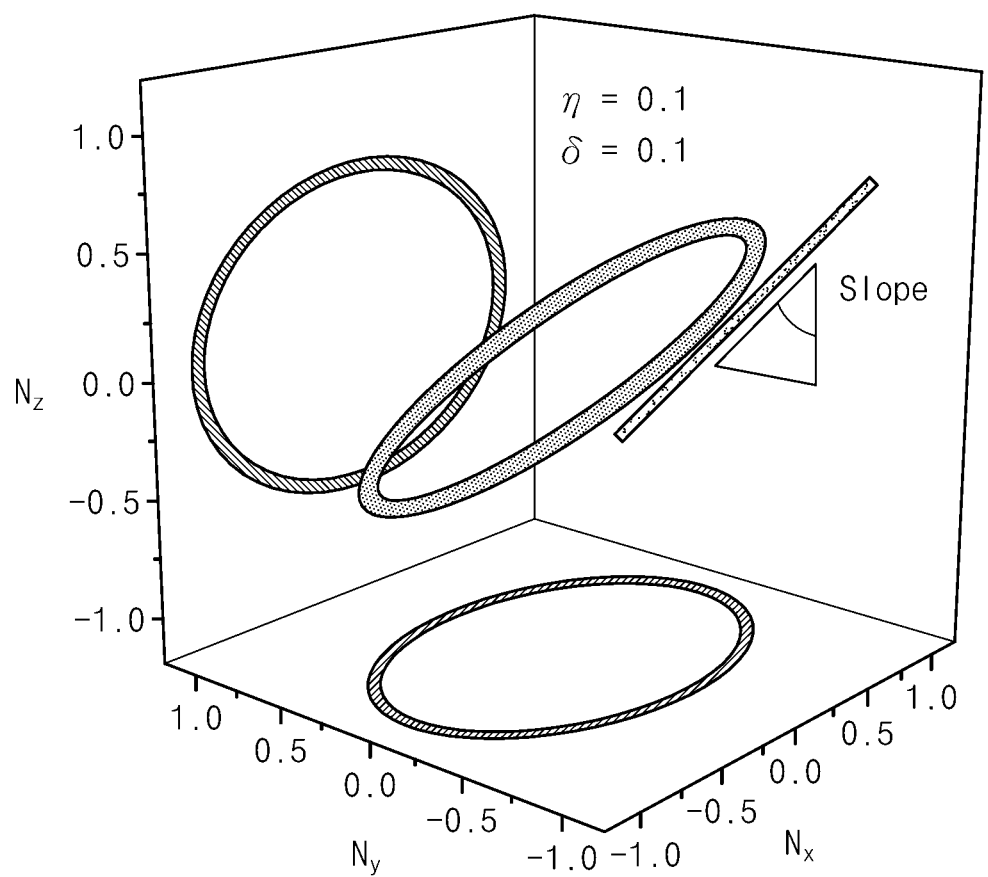
FIG. 4 is a simulation result showing a trajectory of normalized magnetization of an antiferromagnetic layer (or a ferrimagnetic layer) in a magnetic nano-oscillating device according to an example embodiment of the present disclosure.

FIG. 4 is a simulation result showing a trajectory of normalized magnetization of an antiferromagnetic layer (or a ferrimagnetic layer) in a magnetic nano-oscillating device 200 according to an example embodiment of the present disclosure.

Referring to FIG. 4, an effect of the magnetic nano-oscillating device was confirmed through macrospin micromagnetic simulation using an equation of motion of magnetization.

A structure and physical properties of the magnetic nano-oscillating device are as follows:
cross-sectional area of an overall structure=0.8×20 nm², and
antiferromagnetic layer 230: "thickness (t)=3 nm, saturated magnetization value $M_s$=400 emu/cm³, Gilbert damping constant α=0.01, gyromagnetic ratio γ=1.76× $10^7$ Oe$^{-1}$s$^{-1}$, antiferromagnetic exchange interaction constant, antiferromagnetic exchange stiffness A=1× $10^{-7}$ erg/cm, effective magnetic anisotropy energy constant, and effective magnetic anisotropy constant K=1× $10^5$ erg/cm³".

The ratio η of the spin current, transferring the y-direction spin $\sigma_y$, to the applied current is 0.1, and the ratio δ of the spin current, transferring the z-direction spin $\sigma_z$, to the applied current is 0.1. In this case, normalized magnetization N includes an elliptical component projected in an x-y plane and an elliptical component projected in an x-z plane. Accordingly, when the normalized magnetization N is projected in a y-z plane, the normalized magnetization N is shown as a straight line having a constant slope.

Figure 5:
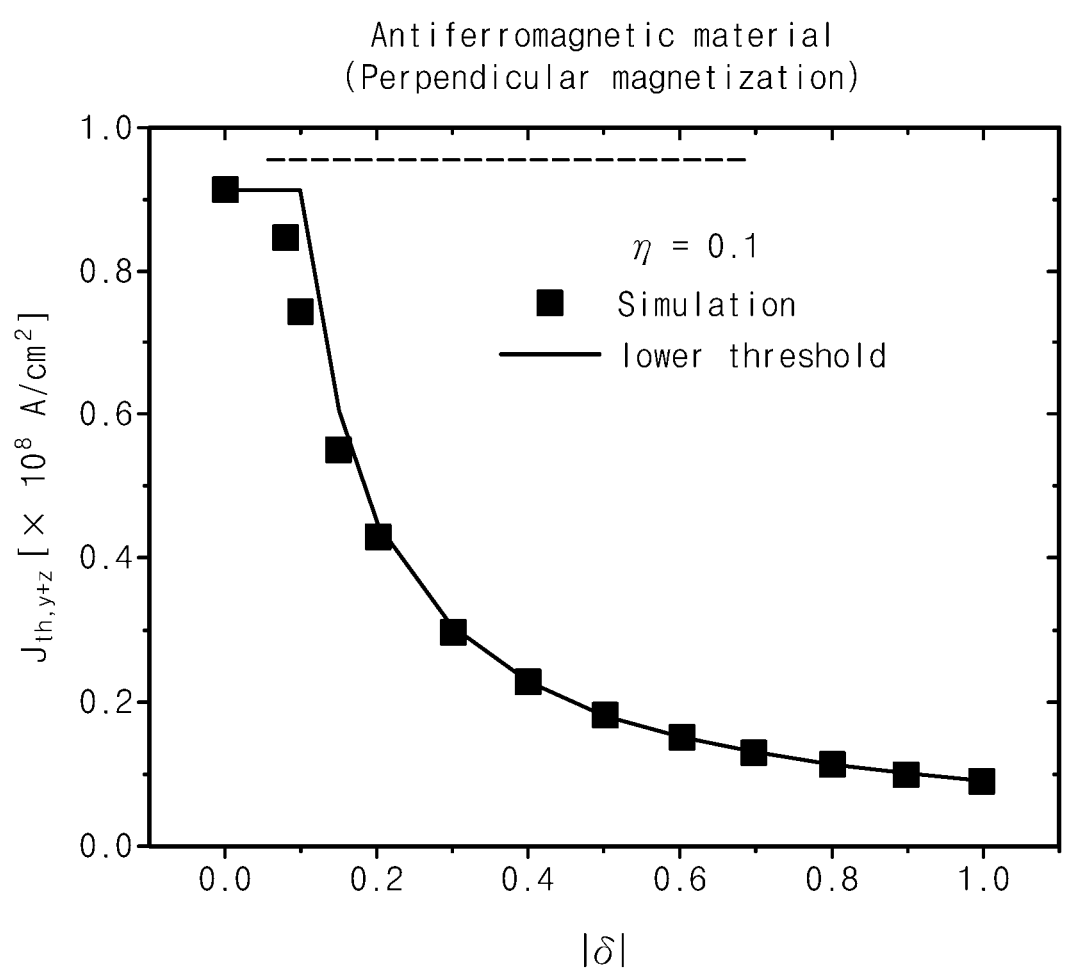
FIG. 5 is a graph showing threshold current density depending on a ratio of spin current, transferring a z-direction spin $\sigma_z$, to applied current in the magnetic nano-oscillating device in FIG. 4.

FIG. 5 is a graph showing threshold current density depending on a ratio of spin current, transferring a z-direction spin $\sigma_z$, to applied current in the magnetic nano-oscillating device 200 in FIG. 4.

Figure 6:
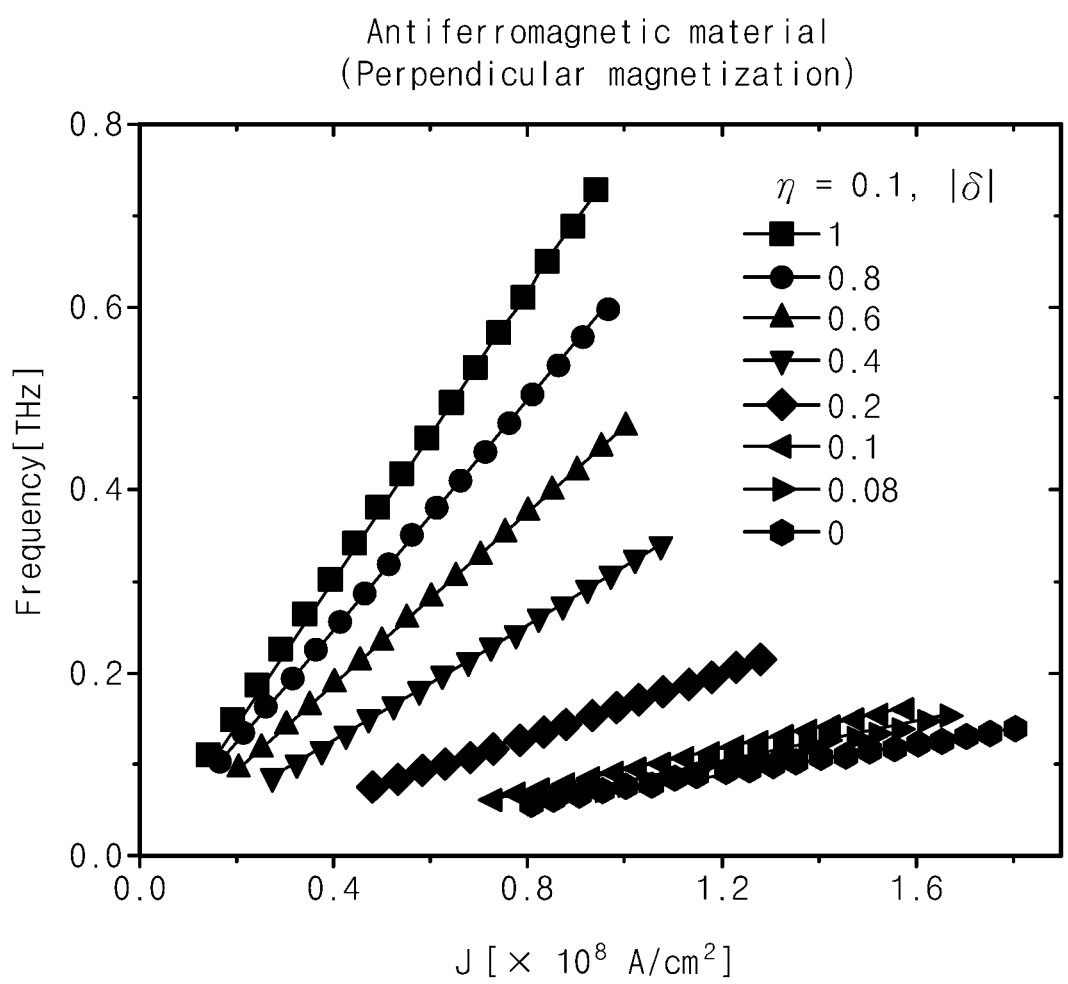
FIG. 6 is a graph showing an oscillation frequency depending on current density in the magnetic nano-oscillating device in FIG. 4.

FIG. 6 is a graph showing an oscillation frequency depending on current density in the magnetic nano-oscillating device 200 in FIG. 4.

Referring to FIG. 5, a ratio η of the spin current, transmitting the y-direction spin $\sigma_y$, to the applied current is 0.1. The antiferromagnetic layer 230 has a sub-lattice magnetization in a direction perpendicular to an arrangement plane (a thickness direction). When an interfacial spin orbital torque is applied to the magnetic nano-oscillating device 200, a ratio δ of the spin current, transferring the z-direction spin $\sigma_z$, and threshold current density $J_{th}$ are shown.

When δ is zero, there is no z-direction spin $\sigma_z$ and threshold current density $J_{th}$ is 0.9×10⁸ A/cm². When δ is 0.9, the threshold current density $J_{th}$ is 0.1×10⁸ A/cm². As the ratio of the z-direction spin $\sigma_z$ is increased, the threshold current density $J_{th}$ is decreased. That is, when a ferromagnetic layer/a nonmagnetic conductive layer are designed to increase an interfacial spin orbital torque, the threshold current density Jth is decreased.

Referring to FIG. 6, when the ratio η of the spin current, transferring the y-direction spin $\sigma_y$, to the applied current is fixed to 0.1 and the ratio δ of the spin current, transferring the z-direction spin $\sigma_z$, to the applied current is changed, applied current density J and an oscillation frequency are shown.

As δ is increased, a slope of a frequency to current density J is increased. Thus, a large frequency difference may be provided with a change in low current density J. When δ=1, an oscillation element may oscillate in the range of 0.1 THz to 0.7 THz depending on the current density.

Figure 7:
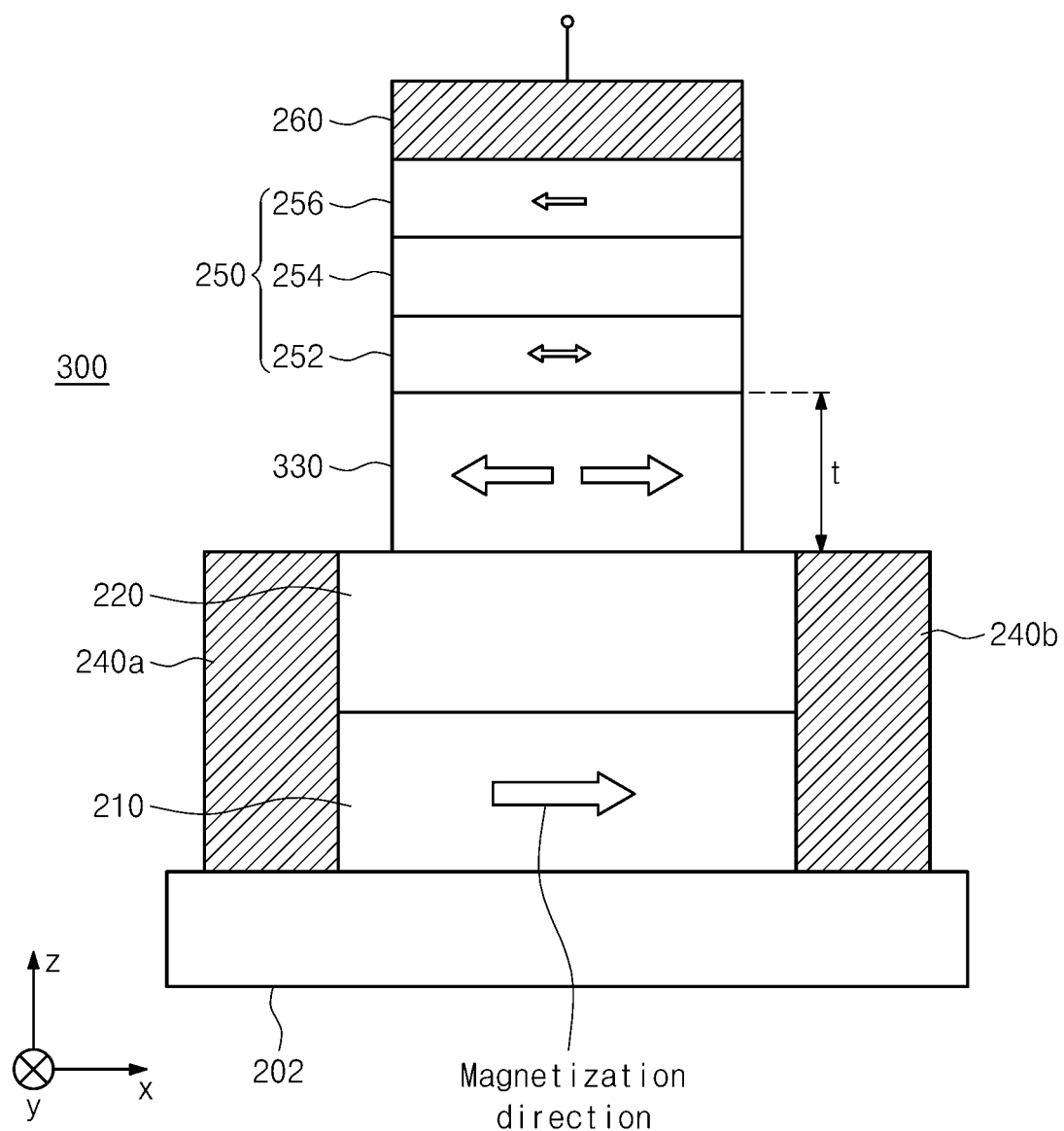
FIG. 7 is a conceptual diagram of a magnetic nano-oscillating device according to another example embodiment of the present disclosure.

FIG. 7 is a conceptual diagram of a magnetic nano-oscillating device according to another example embodiment of the present disclosure.

Figure 8:
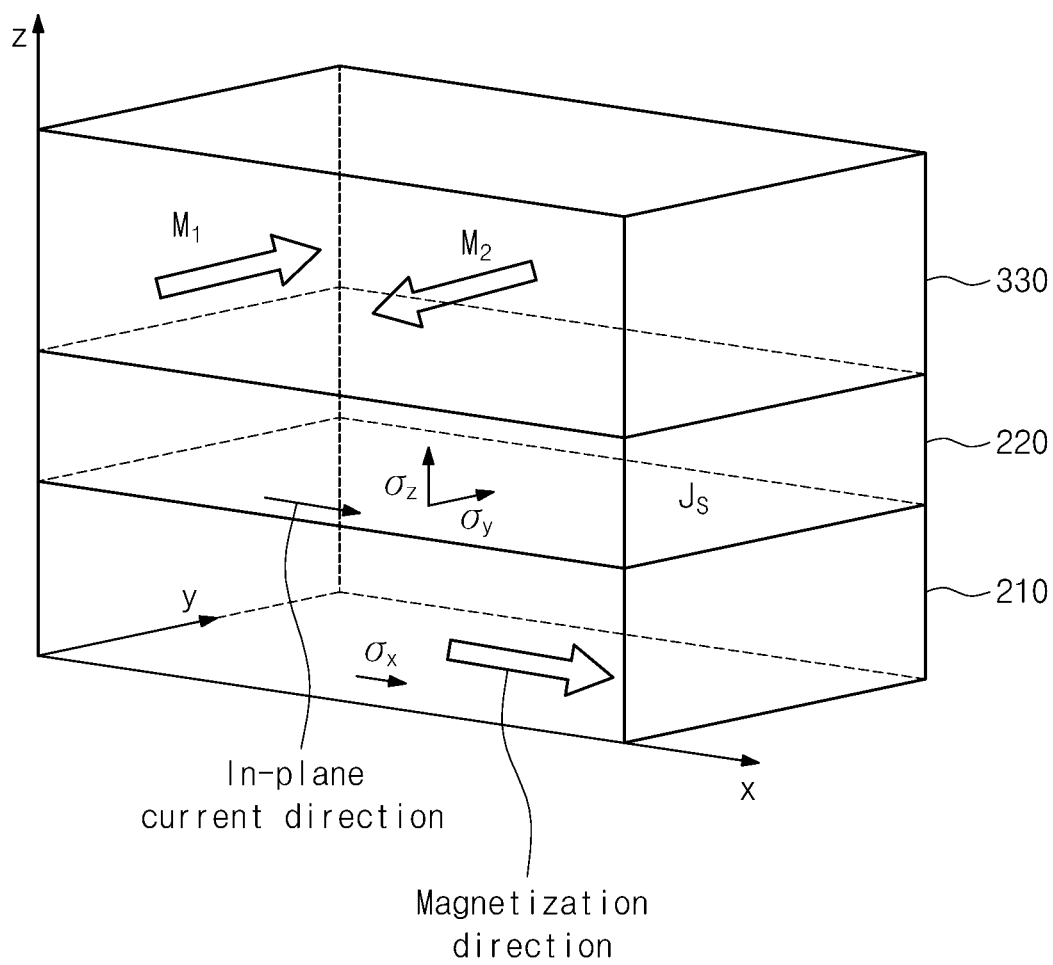
FIG. 8 is a perspective view illustrating oscillation of the magnetic nano-oscillating device in FIG. 7.

FIG. 8 is a perspective view illustrating oscillation of the magnetic nano-oscillating device in FIG. 7.

Figure 9:
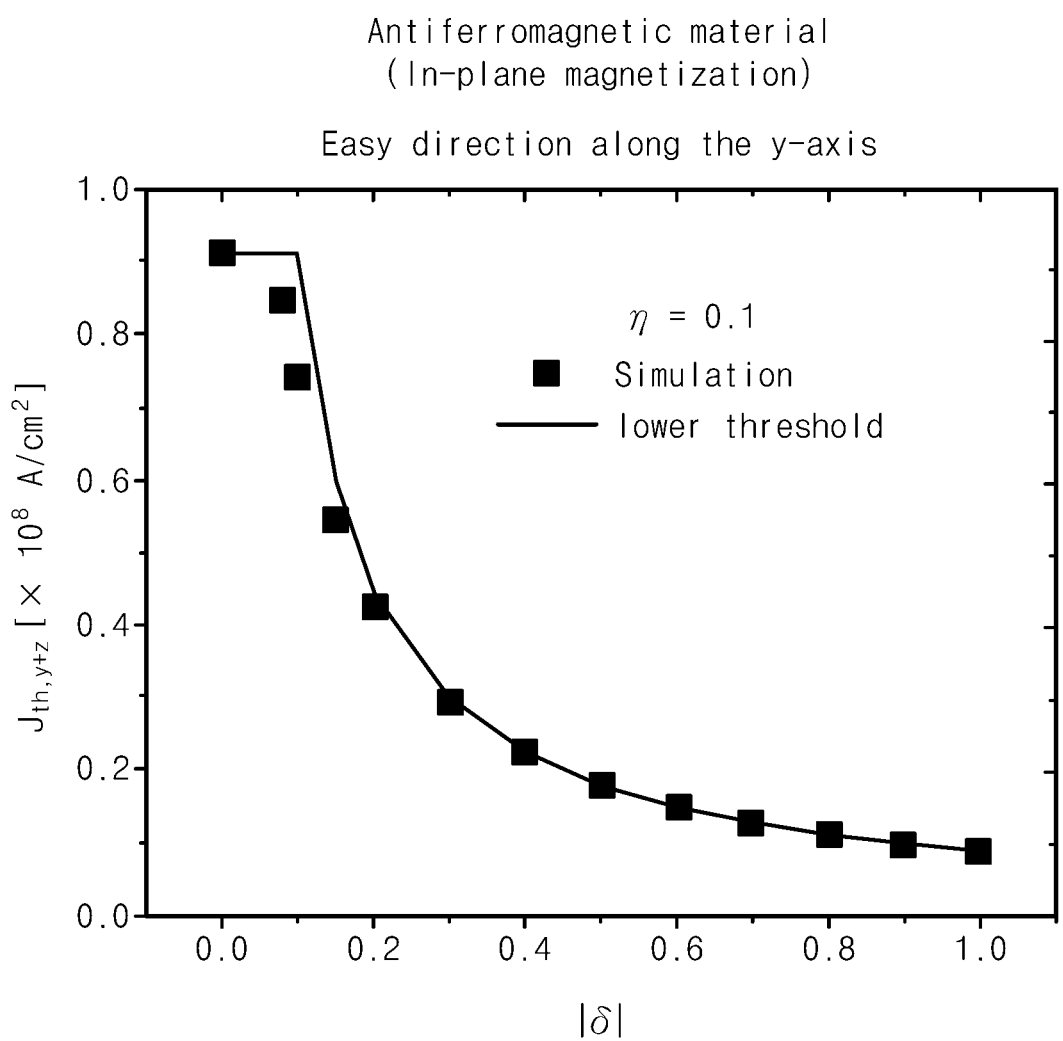
FIG. 9 is a graph showing threshold current density depending on a ratio of spin current, transferring a z-direction spin, to applied current in the magnetic nano-oscillating device in FIG. 8.

FIG. 9 is a graph showing threshold current density depending on a ratio δ of spin current, transferring a z-direction spin $\sigma_z$, to applied current in the magnetic nano-oscillating device in FIG. 8.

Figure 10:
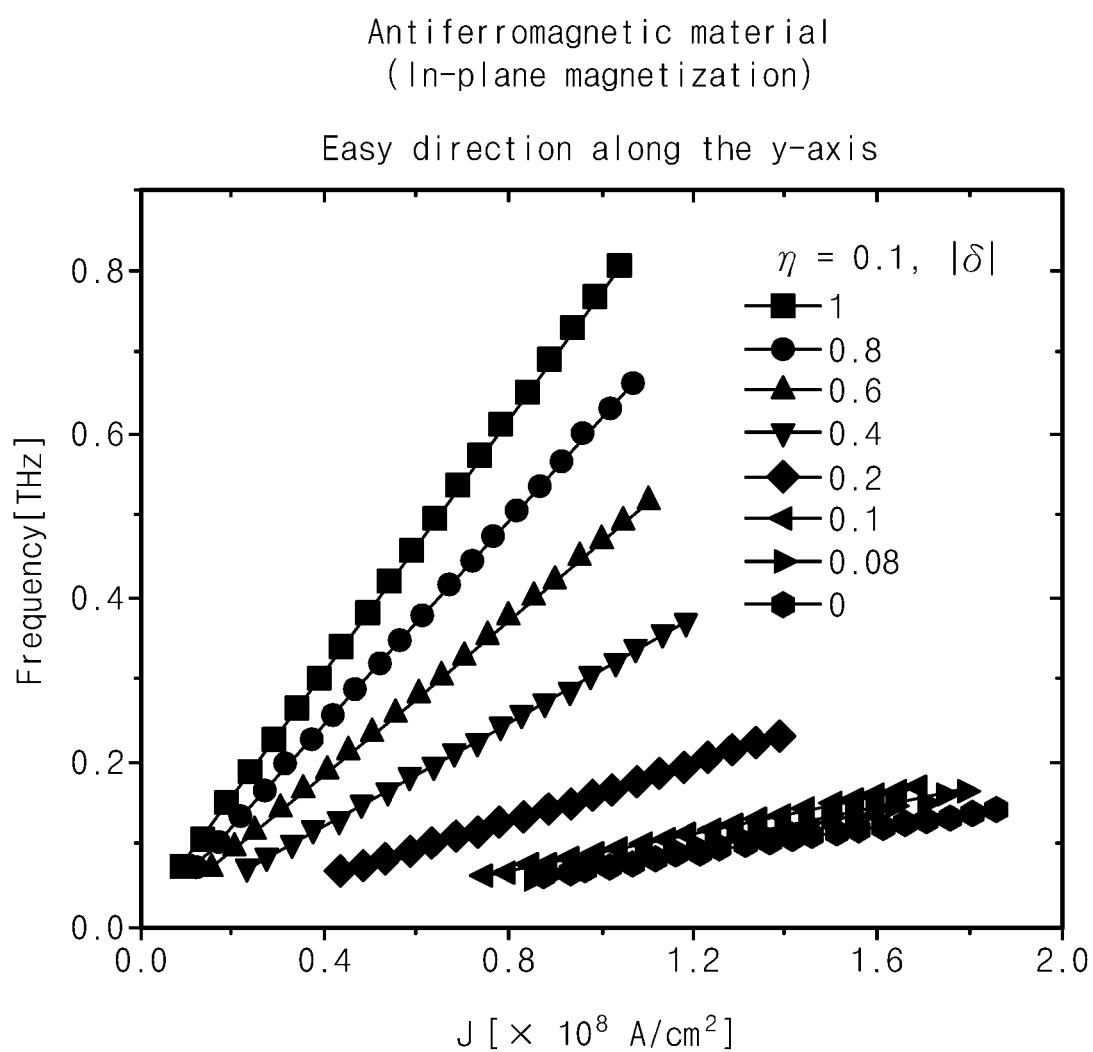
FIG. 10 is a graph showing an oscillation frequency depending on current density.

FIG. 10 is a graph showing an oscillation frequency depending on current density.

Referring to FIGS. 7 to 10, a magnetic nano-oscillating device 300 includes a ferromagnetic layer 210 disposed on a substrate 202, a nonmagnetic conductive layer 220 stacked on the ferromagnetic layer 210, an antiferromagnetic layer 330 stacked on the nonmagnetic conductive layer 220, and first and second electrodes 240a and 240b, respectively being in contact with both side surfaces of the ferromagnetic layer 210 and the nonmagnetic conductive layer 220. The antiferromagnetic layer 330 is a thin film formed of a material magnetized in an in-plane direction to a layer surface, and the ferromagnetic layer 210 is in-plane magnetized on a layer surface of the ferromagnetic layer 210. In-plane current, injected into the ferromagnetic layer 210 and the nonmagnetic conductive layer 220 through the first and second electrodes 240a and 240b, provides spin current, including a spin in a thickness direction of a thin film transferred to the antiferromagnetic layer 330, to cause magnetization precession of a sub-lattice of the antiferromagnetic layer 330. The antiferromagnetic layer 330 is magnetized in an in-plane direction.

The magnetic tunnel junction 250 is disposed on the antiferromagnetic layer 330. The magnetic tunnel junction 250 includes a free layer 252/a tunnel insulating layer 254/a pinned layer 256, and the free layer 252 of the magnetic tunnel junction has an exchange interaction with the antiferromagnetic layer 330. The free layer 252 and the pinned layer 256 may be magnetized in an arrangement plane.

Referring to FIG. 9, a ratio η of spin current, transferring a y-direction spin $\sigma_y$, to applied current is 0.1. The antiferromagnetic layer 330 has sub-lattice magnetization in an arrangement plane. An easy magnetization axis of the antiferromagnetic layer 330 is a y axis. When an interfacial spin orbital torque was applied to the magnetic nano-oscillating device 300, threshold current density $J_{th}$ and an oscillation frequency f were simulated under the following conditions.

A structure and physical properties of magnetic nano-oscillating device 300 are as follows:
cross-sectional area of overall structure=0.8×0.8 nm$^2$, and
antiferromagnetic layer 330: "thickness (t)=3 nm, saturated magnetization value Ms=400 emu/cm$^3$, Gilbert damping constant α=0.01, magnetic rotation ratio γ=1.76×10$^7$ Oe$^{-1}$s$^{-1}$, antiferromagnetic exchange interaction constant A=1×10$^{-7}$ erg/cm, and effective magnetic anisotropy energy constant K)=1×10$^5$ erg/cm$^3$."

When δ is zero, there is no z-direction spin $\sigma_z$ and threshold current density $J_{th}$ is 0.9×10$^8$ A/cm$^2$. When δ is 0.9, threshold current density $J_{th}$ is 0.1×10$^8$ A/cm$^2$. As the ratio of the z-direction spin $\sigma_z$ is increased, the threshold current density $J_{th}$ is decreased. That is, when a ferromagnetic layer/a nonmagnetic layer are designed to increase the interfacial spin trajectory torque, the threshold current density $J_{th}$ is decreased.

Referring to FIG. 10, when a ratio η of spin current, transferring a y-direction spin $\sigma_y$, to the applied current is fixed to 0.1 and a ratio δ of spin current, transferring a z-direction spin $\sigma_z$, to the applied current is changed, applied current density J and an oscillation frequency are shown.

As δ is increased, a slope of a frequency to the current density J is increased. Therefore, a large frequency difference may be provided with a change in low current density J.

Figure 11:
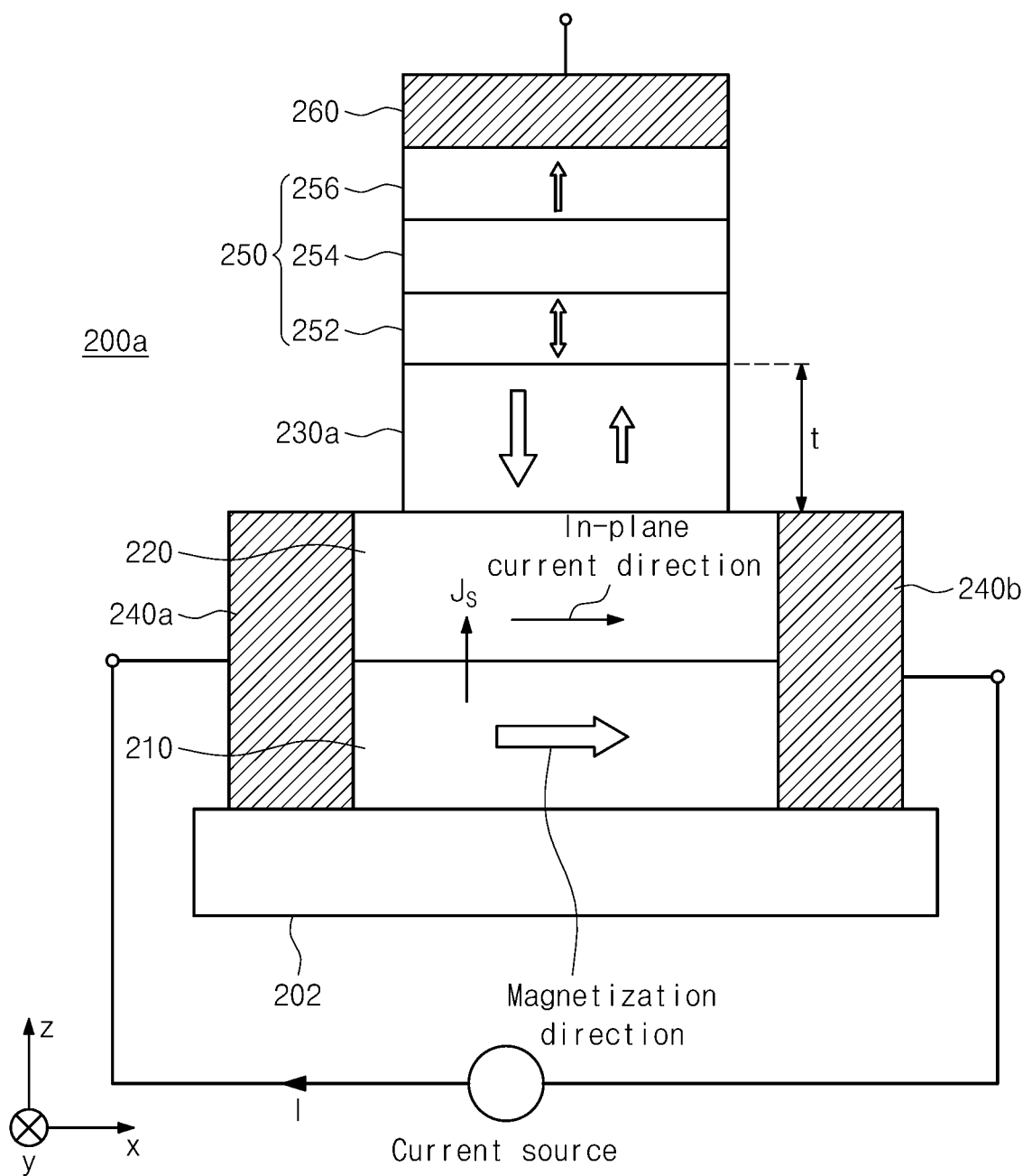
FIG. 11 is a conceptual diagram of a magnetic nano-oscillating device according to another example embodiment of the present disclosure.

FIG. 11 is a conceptual diagram of a magnetic nano-oscillating device 200a according to another example embodiment of the present disclosure.

Figure 12:
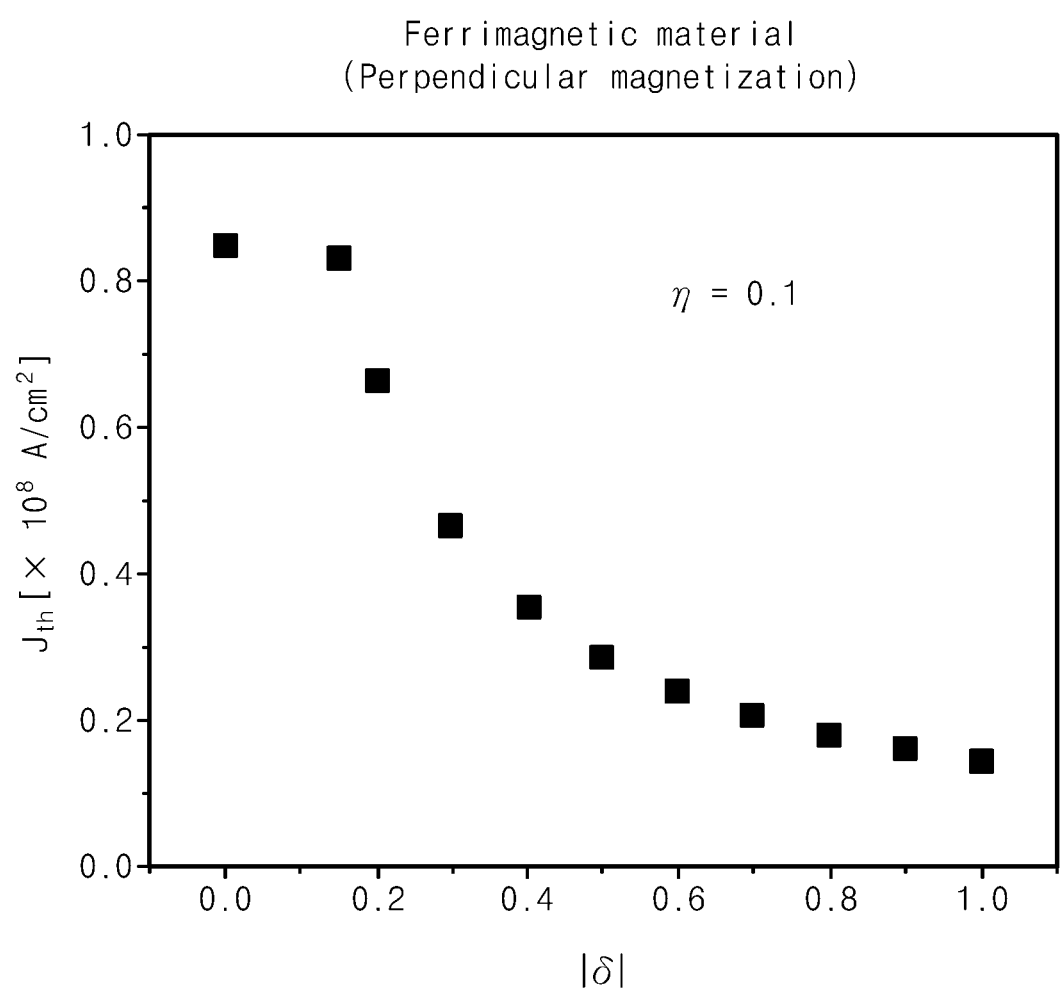
FIG. 12 is a graph showing threshold current density depending on a ratio of spin current, transferring a z-direction spin, to applied current in the magnetic nano-oscillating device in FIG. 11.

FIG. 12 is a graph showing threshold current density depending on a ratio of spin current, transferring a z-direction spin, to applied current in the magnetic nano-oscillating device 200a in FIG. 11.

Figure 13:
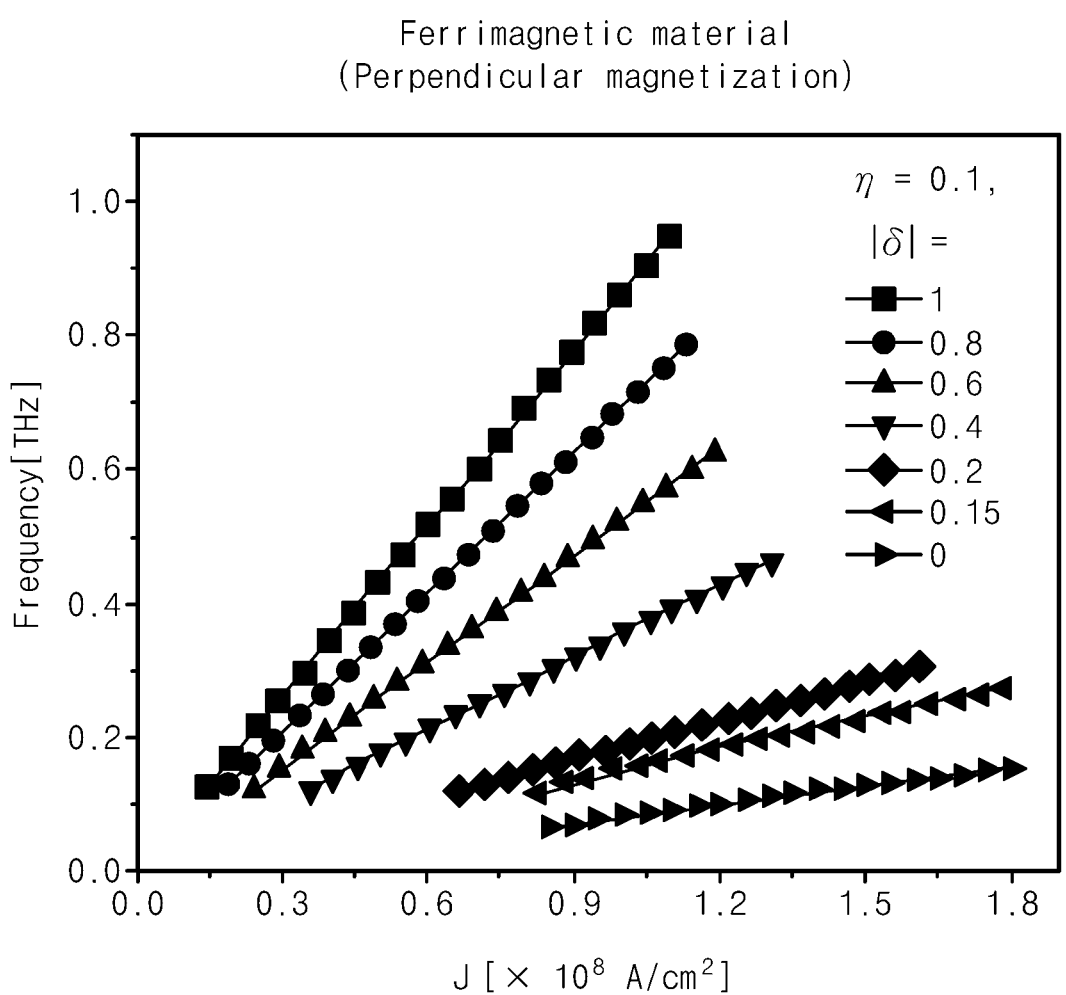
FIG. 13 is a graph showing an oscillation frequency depending on current density in the magnetic nano-oscillating device in FIG. 11.

FIG. 13 is a graph showing an oscillation frequency depending on current density in the magnetic nano-oscillating device 200a in FIG. 11.

Referring to FIGS. 11 to 13, the magnetic nano-oscillating device 200a includes a ferromagnetic layer 210 disposed on a substrate 202, a nonmagnetic conductive layer 220 stacked on the ferromagnetic layer 210, a ferrimagnetic layer 230a stacked on the nonmagnetic conductive layer 220; and first and second electrodes 240a and 240b, respectively being in contact with both side surfaces of the ferromagnetic layer 210 and the nonmagnetic conductive layer 220. The ferrimagnetic layer 230a is a thin film formed of a material magnetized in a perpendicular or in-plane direction to a layer surface. The ferromagnetic layer 210 is in-plane magnetized on a layer surface of the ferromagnetic layer 210. In-plane current, injected into the ferromagnetic layer 210 and the nonmagnetic conductive layer 220 through the first and second electrodes 240a and 240b, provides spin current, including a spin in a thickness direction of a thin film transferred to the ferrimagnetic layer 210, to cause magnetization precession of a sub-lattice of the ferrimagnetic layer 230a.

A structure and physical properties of the nano-oscillating device 200a are as follows:
cross-sectional area of overall structure=0.8×20 nm$^2$, and
ferrimagnetic layer 230a: "thickness t=3 nm, saturated magnetization value of sub-lattice 1 $M_{s,1}$=400 emu/cm$^3$, saturated magnetization value of sub-lattice 2 $M_{s,2}$=350 emu/cm$^3$, gyromagnetic ratio of sub-lattice 1 γ1=1.936×10$^7$ Oe$^{-1}$s$^{-1}$, gyromagnetic ratio of sub-lattice 2 γ2=1.76×10$^7$ Oe$^{-1}$s$^{-1}$, Gilbert damping constant α=0.01, antiferromagnetic exchange interaction constant A=1×10$^{-7}$ erg/cm, and effective magnetic anisotropy energy constant K=1×10$^5$ erg/cm$^3$."

The ferrimagnetic layer 230a may be formed of one selected from Co, Gd, Tb, Mn, Ir, Ge, Se, Cr, Y, Fe, garnet, a rare earth-transition metal (RE-TM) alloy, mixtures thereof.

When a ferromagnetic layer/a nonmagnetic conductive layer are designed to increase an interfacial spin orbital torque, threshold current density $J_{th}$ is decreased.

When a ratio η of spin current, transferring a y-direction spin $\sigma_y$, to applied current is fixed to 0.1 and a ratio δ of spin current, transferring a z-direction spin $\sigma_z$, to the applied current is changed, applied current density J and an oscillation frequency are shown.

As δ is increased, a slope of a frequency to the current density J is increased. Therefore, a large frequency difference may be provided with a change in low current density J. When δ=1, an oscillation element may oscillate in the range of 0.1 THz to 0.9 THz depending on the current density.

Figure 14:
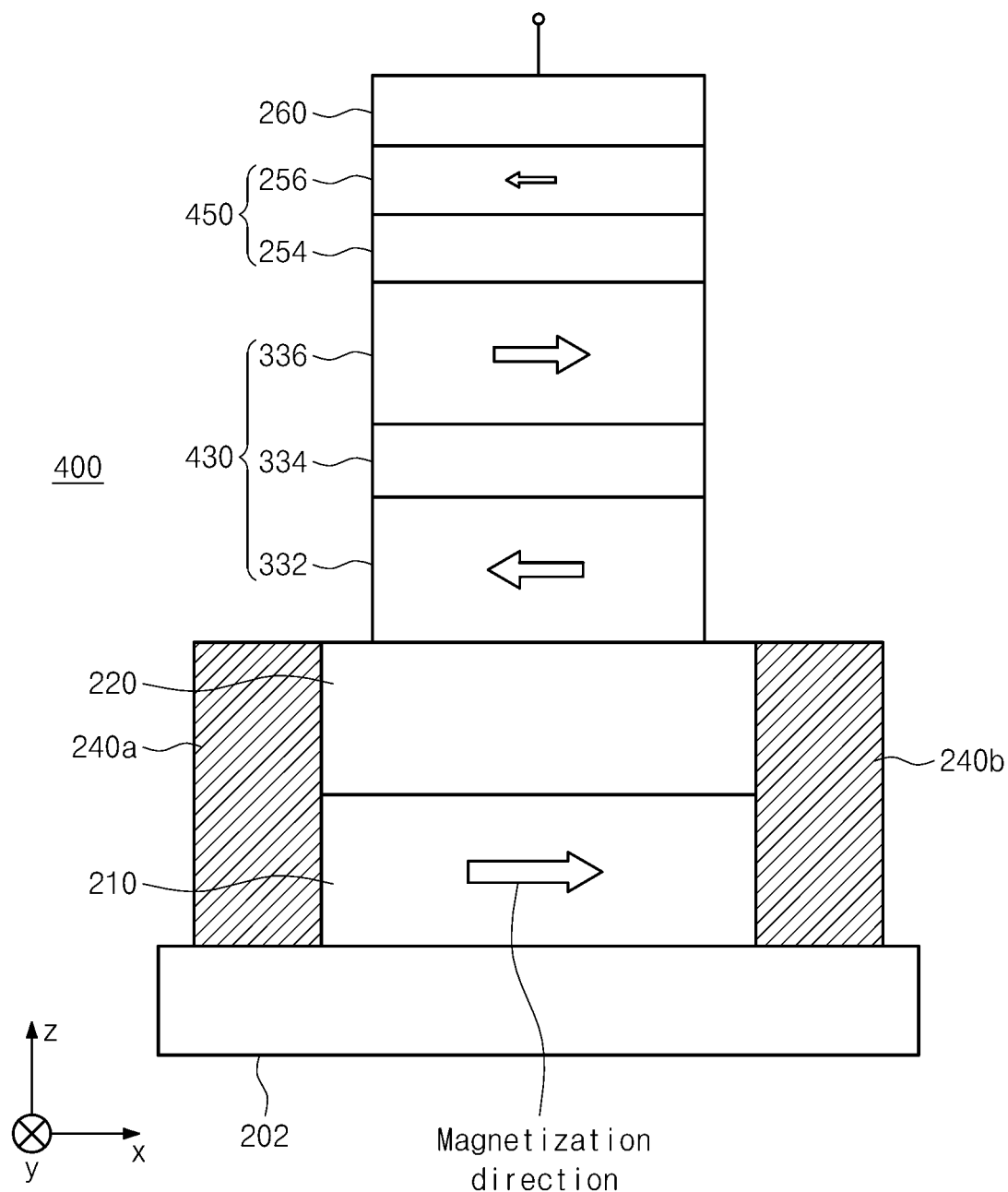
FIG. 14 is a conceptual diagram of a magnetic nano-oscillating device according to another example embodiment of the present disclosure.

FIG. 14 is a conceptual diagram of a magnetic nano-oscillating device according to another example embodiment of the present disclosure.

Referring to FIG. 14, a magnetic nano-oscillating device 400 includes a first ferromagnetic layer 210 disposed on a substrate 202, a first nonmagnetic conductive layer 220 disposed on the first ferromagnetic layer 210, a second ferromagnetic layer 332 disposed on the first nonmagnetic conductive layer 220, a second nonmagnetic conductive layer 334 disposed on the second ferromagnetic layer 332, a third ferromagnetic layer 336 disposed on the second nonmagnetic conductive layer 334, and first and second electrodes 240a and 240b, respectively being in contact with both side surfaces of the first ferromagnetic layer 210 and the first nonmagnetic conductive layer 220. The first ferromagnetic layer 210 is a thin film formed of a material having a fixed magnetization direction and magnetized in a direction parallel to a layer surface. The second ferromagnetic layer 332 and the third ferromagnetic layer 336 are thin films, each having an antiferromagnetic exchange interaction due to the second nonmagnetic conductive layer 334. The second ferromagnetic layer 332 and the third ferromagnetic layer 336 are magnetized to be parallel or perpendicular to the layer surface. In-plane current, injected into the first ferromagnetic layer 210 and the first nonmagnetic conductive layer 220 through the first and second electrodes 240a and 240b, provides spin current including a spin in a thickness direction of a thin film transferred to the second ferromagnetic layer 332 and the third ferromagnetic layer 336 to cause magnetization precession of each of the second ferromagnetic layer 332 and the third ferromagnetic layer 336.

The first ferromagnetic layer 210 and the first nonmagnetic conductive layer 220 may be vertically aligned.

In addition, the second ferromagnetic layer 332, the second nonmagnetic conductive layer 334, and the third ferromagnetic layer 336 may be vertically aligned and coupled by an antiferromagnetic exchange interaction. The second ferromagnetic layer 332 and the third ferromagnetic layer 336 may always move in precession while maintaining antiferromagnetic coupling.

A magnetic tunnel junction 450 is disposed on the third antiferromagnetic layer 336. The magnetic tunnel junction 250 may include a tunnel insulating layer 254/a pinned layer 265, and the pinned layer 256 of the magnetic tunnel junction may interact with the third ferromagnetic layer 336 to generate a tunnel magnet resistance signal. The fixed layer 256 may be magnetized to be parallel or vertical in a plane.

Each of the first ferromagnetic layer 210, the second ferromagnetic layer 332, and the third ferromagnetic layer 336 may be formed of one selected from Fe, Co, Ni, B, Si, Zr, and mixtures thereof. The first nonmagnetic conductive layer 220 may be formed of one selected from Cu, Ta, Pt, W, Ti, Bi, and mixtures thereof. The second nonmagnetic conductive layer 334 may be formed of one selected from Ru, Ta, Rh, Ir, Cr, Re, Mo, W, V, and mixtures thereof.

As described above, in a magnetic nano-oscillating device according to an example embodiment, spin-polarized spin current may be generated in an interface between a ferromagnetic layer and a nonmagnetic layer while in-plane current passes through the ferromagnetic layer and the nonmagnetic layer, the spin current may transfer an interfacial spin-orbit torque to an antiferromagnetic layer (or a ferromagnetic layer), and the interfacial spin-orbit torque may induce a magnetization precession motion of a sub-lattice of the antiferromagnetic layer (or the ferromagnetic layer).

In a magnetic nano-oscillating device according to an example embodiment, a magnetization precession motion of a sub-lattice of the antiferromagnetic layer (or ferromagnetic layer) may be induced to improve frequency tunability.

A magnetic nano-oscillating device according to an example embodiment may include a ferromagnetic layer, a nonmagnetic layer, and a layer having an antiferromagnetic exchange interaction. The ferromagnetic layer may have a fixed magnetization direction, and may be a thin film formed of a material magnetized in a direction parallel to a layer surface. In addition, a magnetization precession motion of the layer having an antiferromagnetic exchange interaction may be induced by spin current generated in an interface between the ferromagnetic layer and the nonmagnetic layer.

Although the present disclosure and its advantages have been described in detail, it should be understood that various changes, substitutions and alterations can be made herein without departing from the spirit and scope of the disclosure as defined by the following claims.

What is claimed is:

1. A magnetic nano-oscillating device comprising: a ferromagnetic layer disposed on a substrate; a nonmagnetic conductive layer stacked on the ferromagnetic layer; an antiferromagnetic layer stacked on the nonmagnetic conductive layer; and first and second electrodes disposed perpendicular to and being in contact with the ferromagnetic layer and the nonmagnetic conductive layer, respectively, wherein the antiferromagnetic layer is a thin film formed of a material magnetized in a perpendicular of in-plane direction to a layer surface, wherein the ferromagnetic layer is in-plane magnetized on a layer surface of the ferromagnetic layer, and wherein in-plane current, injected into the ferromagnetic layer and the nonmagnetic conductive layer through the first and second electrodes, provides spin current, including a spin in a thickness direction of a thin film transferred to the antiferromagnetic layer, to cause magnetization precession of a sub-lattice of the antiferromagnetic layer.

2. The magnetic nano-oscillating device as set forth in claim 1, further comprising:
a magnetic tunnel junction disposed on the antiferromagnetic layer,
wherein the magnetic tunnel junction comprises a free layer, a tunnel insulating layer, and a pinned layer, and
wherein the free layer of the magnetic tunnel junction has an exchange interaction with the antiferromagnetic layer.

3. The magnetic nano-oscillating device as set forth in claim 1, wherein the ferromagnetic layer is formed of one selected from Fe, Co, Ni, B, Si, Zr, and mixtures thereof.

4. The magnetic nano-oscillating device as set forth in claim 1, wherein the antiferromagnetic layer is formed of one selected from Ir, Pt, Mn, Cr, FeMn, NiO, Fe2O3, and mixtures thereof.

5. The magnetic nano-oscillating device as set forth in claim 1, wherein the nonmagnetic conductive layer is formed of one selected from Cu, Ta, Pt, W, Ti, Bi, and mixtures thereof.

6. The magnetic nano-oscillating device as set forth in claim 1, wherein each of the first and second electrodes is formed of one selected from Cu, Ta, Pt, W, Ti, Bi, Ir, and mixtures thereof.

7. A magnetic nano-oscillating device comprising: a ferromagnetic layer disposed on a substrate; a nonmagnetic conductive layer stacked on the ferromagnetic layer; a ferrimagnetic layer stacked on the nonmagnetic conductive layer; and first and second electrodes disposed perpendicular to and being in contact with the ferromagnetic layer and the nonmagnetic conductive layer, respectively, wherein the ferrimagnetic layer is a thin film formed of a material magnetized in a perpendicular or in-plane direction to a layer surface, wherein the ferromagnetic layer is in-plane magnetized on a layer surface of the ferromagnetic layer, and wherein in-plane current, injected into the ferromagnetic layer and the nonmagnetic conductive layer through the first and second electrodes, provides spin current, including a spin in a thickness direction of a thin film transferred to the ferrimagnetic layer, to cause magnetization precession of a sub-lattice of the ferrimagnetic layer.

8. The magnetic nano-oscillating device as set forth in claim 7, further comprising:

a magnetic tunnel junction disposed on the ferrimagnetic layer, wherein the magnetic tunnel junction comprises a free layer, a tunnel insulating layer, and a pinned layer, and wherein the free layer of the magnetic tunnel junction has an exchange interaction with the antiferromagnetic layer.

9. The magnetic nano-oscillating device as set forth in claim 7, wherein the ferrimagnetic layer is formed of one selected from Co, Gd, Tb, Mn, Ir, Ge, Se, Cr, Y, Fe, garnet, a rare earth-transition metal (RE-TM) alloy, mixtures thereof.

10. A magnetic nano-oscillating device comprising:

a first ferromagnetic layer disposed on a substrate;

a first nonmagnetic conductive layer disposed on the first ferromagnetic layer;

a second ferromagnetic layer disposed on the first nonmagnetic conductive layer;

a second nonmagnetic conductive layer disposed on the second ferromagnetic layer;

a third ferromagnetic layer disposed on the second nonmagnetic conductive layer; and first and second electrodes disposed perpendicular to and being in contact with the first ferromagnetic layer and the first nonmagnetic conductive layer, respectively, wherein the first ferromagnetic layer is a thin film formed of a material having a fixed magnetization direction and magnetized in a direction parallel to a layer surface, wherein the second ferromagnetic layer and the third ferromagnetic layer are thin films, each having an antiferromagnetic exchange interaction due to the second nonmagnetic conductive layer, and wherein in-plane current, injected into the first ferromagnetic layer and the first nonmagnetic conductive layer through the first and second electrodes, provides spin current including a spin in a thickness direction of a thin film transferred to the second ferromagnetic layer and the third ferromagnetic layer to cause magnetization precession of each of the second ferromagnetic layer and the third ferromagnetic layer.

11. The magnetic nano-oscillating device as set forth in claim 10, further comprising:

a magnetic tunnel junction disposed on the third ferromagnetic layer, wherein the magnetic tunnel junction includes a tunnel insulating layer and a pinned layer.

12. The magnetic nano-oscillating device as set forth in claim 10, wherein each of the first ferromagnetic layer, the second ferromagnetic layer, and the third ferromagnetic layer is formed of one selected from Fe, Co, Ni, B, Si, Zr, and mixtures thereof, the first nonmagnetic conductive layer is formed of one selected from Cu, Ta, Pt, W, Ti, Bi, and mixtures thereof, and the second nonmagnetic conductive layer is formed of one selected from Ru, Ta, Rh, Ir, Cr, Re, Mo, W, V, and mixtures thereof.

\* \* \* \* \*